(12) United States Patent
Glovatsky et al.

(10) Patent No.: US 6,408,811 B1
(45) Date of Patent: *Jun. 25, 2002

(54) VEHICLE ENGINE COMPONENTS PROVIDING INTEGRAL INTERCONNECT CIRCUITRY SYSTEM

(75) Inventors: Andrew Zachary Glovatsky, Plymouth; Jay DeAvis Baker, Dearborn; Myron Lemecha, Dearborn Heights, all of MI (US)

(73) Assignee: Visteon Global Technologies, Inc., Dearborn, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/551,371

(22) Filed: Apr. 18, 2000

Related U.S. Application Data
(60) Provisional application No. 60/130,860, filed on Apr. 22, 1999.

(51) Int. Cl.[7] .............................................. F02P 23/00
(52) U.S. Cl. ............................................... 123/184.61
(58) Field of Search .................................... 123/184.61

(56) References Cited

U.S. PATENT DOCUMENTS 5,743,235 A * 4/1998 Lueder .................. 123/184.61
6,186,106 B1 * 2/2001 Glovatsky et al. ..... 123/184.61

* cited by examiner

Primary Examiner—Noah P. Kamen
Assistant Examiner—Jason Benton
(74) Attorney, Agent, or Firm—Quarles & Brady LLP

(57) ABSTRACT

Conductors supported integrally with engine structure such as air intake manifolds and the like provide interconnection between engine components without the need for separate conventional wiring harnesses. The conductors take their mechanical strength from the underlying physical object and thus can be lighter than a freestanding harness. Connectors allow traces to continue across points of mechanical interface between structural components and allow wiring of engine components to be accomplished in the same operation as their physical assembly.

26 Claims, 5 Drawing Sheets

VEHICLE ENGINE COMPONENTS PROVIDING INTEGRAL INTERCONNECT CIRCUITRY SYSTEM

CROSS-REFERENCE TO RELATED APPLICATIONS

This application claims priority to provisional Appln. No. 60/130,860, filed Apr. 22, 1999.

STATEMENT REGARDING FEDERALLY SPONSORED RESEARCH OR DEVELOPMENT

BACKGROUND OF THE INVENTION

The present invention relates generally to automotive electronics and in particular to a method of simplifying or eliminating wiring harnesses associated with advanced engine control and integrating engine control electronics with the vehicle engine.

Internal combustion engines used in automobiles and the like employ sophisticated engine control technologies making use of a variety of sensors and actuators in communication with microprocessor-based control circuitry. Engine control provided by these systems may provide increased performance, reduced emissions and higher reliability in the operation of the vehicle.

The microprocessor-based control circuitry may be located near the vehicle fire wall to provide a secure mounting of the circuitry away from the high temperature components of the engine and communicating with driver instrumentation in the passenger compartment.

The control circuitry communicates with a variety of sensors on or close to the engine including, for example, sensors for air mass flow, engine temperature, throttle position, engine speed and crankshaft position. The control circuitry, in receiving these sensor signals, produces actuator signals used to control throttle valves, fuel injectors, ignition coils and the like.

The sensors and actuators must be connected to the control circuitry by wiring and the wiring must be of a sufficient gauge to resist breaking under the tensile loads and flexure incident to normal service. The wires may be bound together in "harnesses" to improve their mechanical resilience and may be sheathed to better resist abrasion.

Wiring harnesses represent a significant cost in the manufacture of a vehicle, not only in costs of material and manufacture, but also in costs of routing and connection to the sensors and actuators. Mechanically robust harnesses add weight to the vehicle affecting vehicle mileage and emissions. The harness with its attendant branching wire sets can increase the clutter of the engine compartment adversely affecting assembly, maintenance and repair of the engine.

BRIEF SUMMARY OF THE INVENTION

The present invention provides an alternative to conventional wiring harnesses that use conductors supported and routed directly on engine components. These engine components guide, support and protect the conductors eliminating unneeded weight and structure incident to conventional harness systems. By eliminating separate harness structure, clutter in the engine compartment is substantially reduced.

The invention can also eliminate the separate assembly steps of attaching the harness to the engine components. This is done by incorporating control electronics directly on the engine structures (eliminating unnecessary points of attachment) and/or by incorporating connectors into the interfaces between engine structures so that mechanical assembly of the engine structures simultaneously accomplishes electrical connection. Engine components may be modified in design to improve their function as wiring support.

Specifically, then, the present invention provides interconnect circuitry system for use with a vehicle engine having control electronics communicating with engine mounted control devices. The interconnect circuitry system includes at least one structural engine component which when assembled to the vehicle engine presents a surface spanning a distance between the control electronics and at least one of the engine mounted control devices. Electrical conductors attach integrally to the surface of the structural engine component to be supported and guided thereby.

It is thus one object of the invention to eliminate the need for separate wiring harnesses by allowing structural engine components to provide interconnect circuitry between engine mounted control devices and control electronics.

The structural components may be, for example, an engine intake manifold, a valve cover, throttle body, air filter housing, or engine shrouding.

Thus it is another object of the invention to select engine components that naturally span the distance between common interconnected devices.

It is yet another object of the invention to provide for an extremely stiff and inelastic support for the conductors such as reduces the need for large gauge conductors.

The electrical conductors may be metal plated on the structural component and etched appropriately or may be preformed metal conductors molded into a molded polymer forming the structural component or may be adhesively or mechanically bonded to the surface of the structural component.

Thus it is another object of the invention to provide simple means for attaching conductors directly to an engine structure with the minimum necessary conductor and additional material.

At least one electrical connector may be integrally attached to the structural component electrically communicating with the electrical conductors.

Thus it is another object of the invention to permit multiple mechanically separable structural components to be fit together to provide interconnect circuitry between devices. It is another object of the invention to allow a structural component to form a portion of the interconnect circuitry between components.

It is another object of the invention to permit the devices to be easily detachable from the interconnect circuitry of the structural component for repair and the like.

The electrical conductors may provide exposed bonding surfaces and the invention may further include bonding solid-state circuitry to the bonding surfaces and integrally to the structural components.

Thus it is another object of the invention to allow the structural components to support not only conductors but also integrated circuits and other circuit components eliminating the need for separate circuit support structure (such as a circuit board) and the need for separate connections to the control circuitry.

The electrical connectors may be positioned at a point of attachment of the structural component with other engine parts so as to electrically connect to electrical conductors on the other engine parts when the structural component is mechanically attached to the other engine components.

Thus it is another object of the invention to allow the single step of mechanically attaching engine components to also provide for electrical connection of various components to each other.

The foregoing and other objects and advantages of the invention will appear from the following description. In this description, reference is made to the accompanying drawings which form a part hereof, and in which there is shown by way of illustration, a preferred embodiment of the invention. Such embodiment does not necessarily represent the full scope of the invention, however, and reference must be made therefore to the claims for interpreting the scope of the invention.

DETAILED DESCRIPTION OF THE INVENTION

Figure 1:
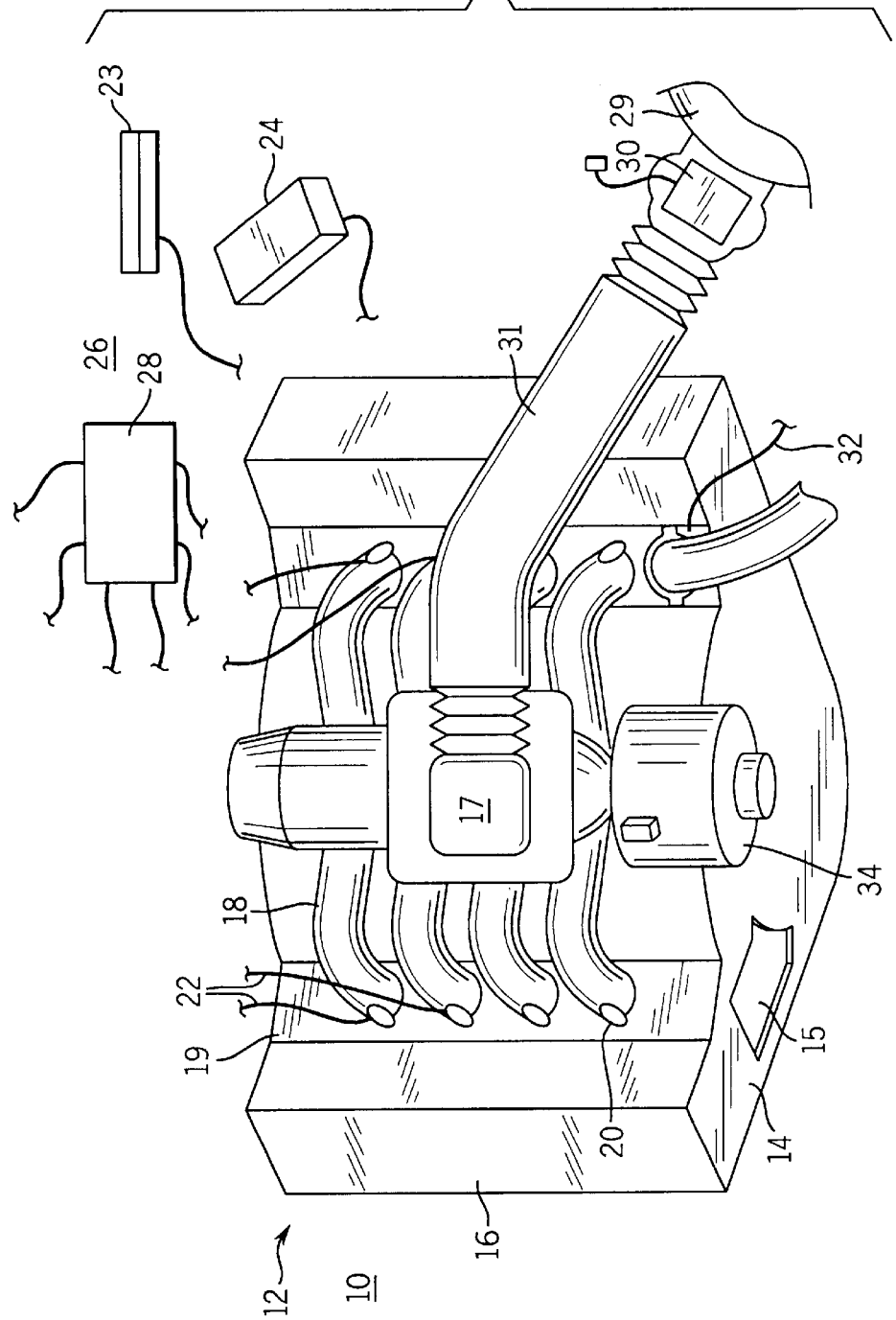
FIG. 1 is a top perspective view of a prior art V-block engine showing engine components interconnected by discrete wiring harnesses.

Referring now to FIG. 1, a prior art engine compartment 10 holds an engine 12 having an engine block 14 supporting ranks of pistons (not shown) within cylinders 19 beneath valve covers 16 and behind engine shrouding 15. An intake manifold 18 of conventional design extends between a throttle 17 and the cylinders 19. An air induction system 31 joins the throttle 17 with air filter housing 29 positioned near a front of the engine compartment 10. Near the point of connection of the intake manifold 18 and the cylinders 19 are positioned combustion control devices 20 including for each cylinder an ignition coil for initiating a spark within the cylinder, an electronic fuel injector for injecting fuel into the cylinder, and possibly one or more valve actuators for controlling cylinder intake and/or exhaust valves.

Each of these combustion control devices 20 includes a wiring harness 22 which may be joined and routed to other devices, such as distributor 28, to ultimately join with an engine control module 23 and/or a vehicle speed control module 24 mounted near a firewall 26. The engine control module 23 and vehicle speed control module 24 may also receive inputs from various sensors including a mass flow sensor 30 positioned near an air filter housing 29, block temperature sensors 32 on the engine block 14, and engine speed sensors and the like (not shown). Harnesses 22 relevant to the present invention may also extend from the alternator 34 and from ancillary automotive systems including braking systems, transmission control and the like which may need to share signals with engine control module 23 and vehicle speed control module 24.

Figure 2:
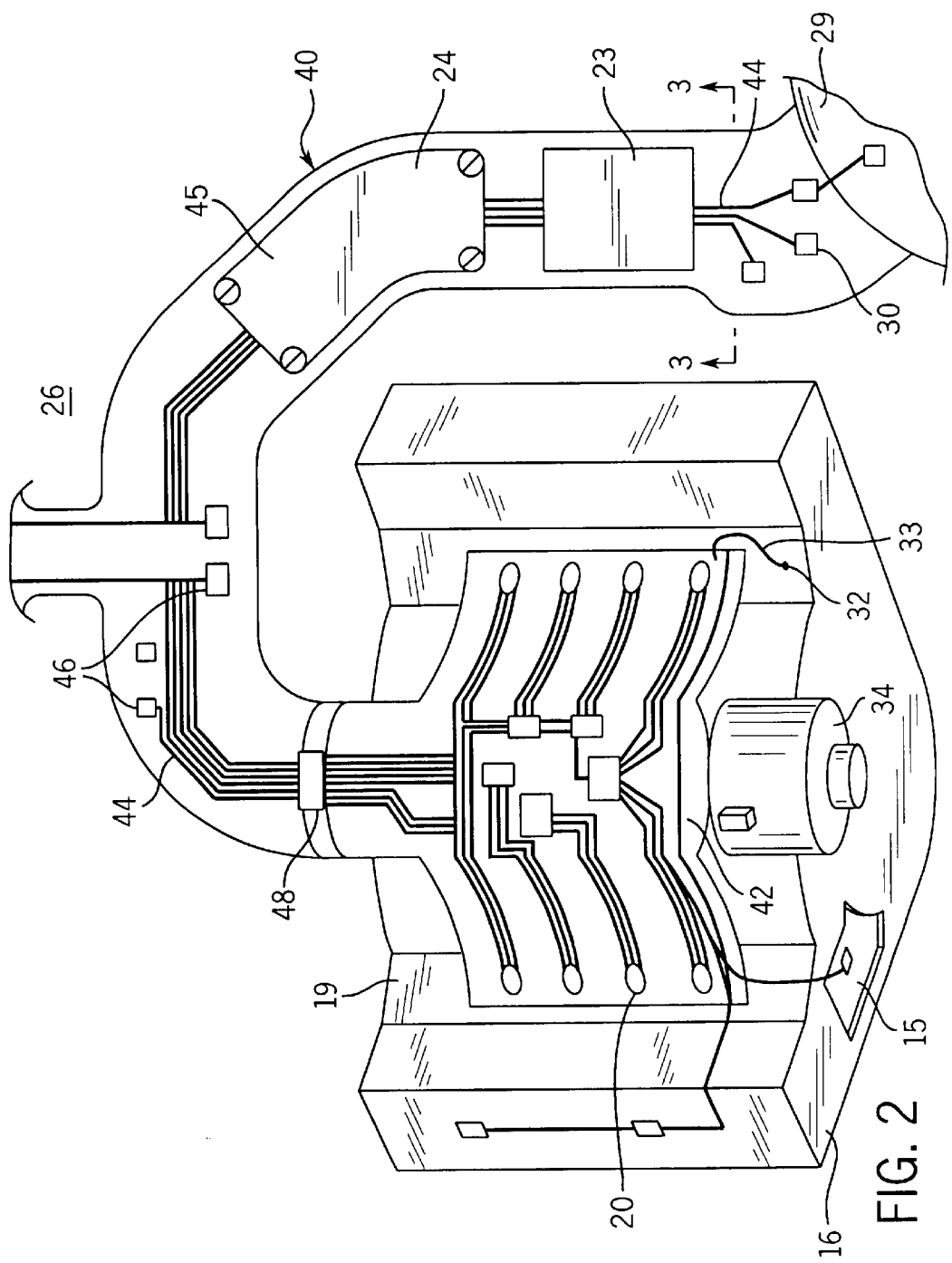
FIG. 2 is a view similar to that of FIG. 1 with the wiring harnesses replaced by conductors integrally bonded to engine components and, in particular, to the valve covers air intake manifold and other parts of the air induction system.

Referring now to FIG. 2, certain of the harnesses 22 may be eliminated by the modification of the air induction system 31 (of FIG. 1) to a continuous air induction system 40 (of FIG. 2) and the attachment of conductors normally in the harnesses 22 directly on the surface of the continuous air induction system 40 as will now be described.

As shown in FIG. 2, the continuous air induction system 40 collects the functions of the intake manifold 18 and air induction system 31 to provide an essentially continuous path from the air filter housing 29 to the combustion control devices 20 passing near the firewall 26 and incorporating on its surface, the electronics of the engine control module 23 and vehicle speed control module 24. The continuous air induction system 40 may further electrically communicate with the air filter housing 29, engine shrouding 15, and the valve cover 16 as will be described.

Generally, the continuous air induction system 40 is a continuous tube branching at a manifold portion 42 to provide air to the various cylinders. On the upper surface of the continuous air induction system 40 which may be advantageously molded from an electrically insulating polymer material, conductors 44 are held communicating with various sensor devices such as the mass air flow sensor 30 which may be mounted directly on the continuous air induction system 40 or block temperature sensor 32 communicating with the manifold portion of the continuous air induction system 40 via a short harness 33. The conductors 44 also communicate directly-with integrated circuits 46 mounted directly on the surface of the continuous air induction system 40 as will be described below. Removable covers 45 may be placed over portions of this circuitry or the integrated circuits to provide for additional protection.

As will be described further below, the conductors 44 may work with integral connectors 48 providing points of connection between the conductors 44 of the main portion of the continuous air induction system 40 and conductors 44 of adjacent manifold portion 42 which may be fabricated as separate physical parts. Connectors 48 may also provide connections with other independent mechanical elements such as the valve covers 16, shrouding 15 and the air filter housing 29 or physically separate components via harnesses 33. The valve cover 16 may have additional circuitry and conductors 44 attached thereto so as to allow control or sensing functions to be performed from the valve covers. Shrouding 15 and air filter housing 29 may likewise include conductors 44 communicating with sensors, actuators, or circuitry held by or near these structures.

Figure 3:
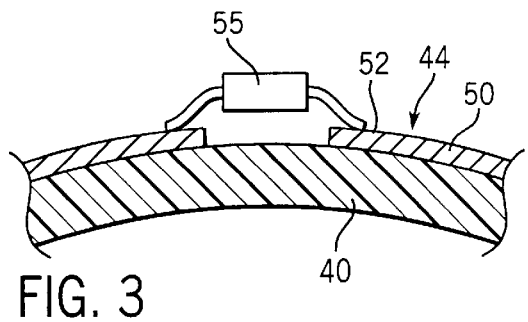
FIG. 3 is a cross-section along line 3—3 of FIG. 2 showing a first embodiment of the invention in which conductors are plated to the surface of the engine components and may have attached circuitry thereon.

Referring now to FIG. 3, the continuous air induction system 40 may have a surface layer of metal 50, for example, copper or a sandwich lamination of multiple metals, and is selectively deposited or attached as a sheet or plated and etched according to techniques well known in the art to provide for the conductors 44. Additional nonconductive layers (not shown) can be added over the plating. The use of additional insulated layers can be used to add plated layers of conductor interconnected in a three dimensional way such as is found in multi-layer circuit boards using through-plating and the like to allow circuit paths to cross without electrical connection. This technique can also be applied to the embodiments of in-molding, bonding and adhesive bonding multiple layers onto the engine component.

Bonding pads 52 may be formed in the metal 50 to which integrated circuits 55 or other electronic components may be attached by soldering, welding, brazing, conductive adhesive or other similar techniques. The continuous air induction system 40 thus serves as a printed circuit-like substrate for electrical components while the conductors 44 provide interconnections for these components.

The mechanical rigidity provided by the continuous air induction system 40, which serves the additional role of conducting air, allows extremely thin layers of metal 50 to serve as conductors 44. This reduces the unnecessary structure and weight to the effective interconnecting process over that which would be required with a harness system. The conductors 44 may be given a conformal coating of an insulating material or the like to protect them from moisture and mechanical abrasion.

Figure 4:
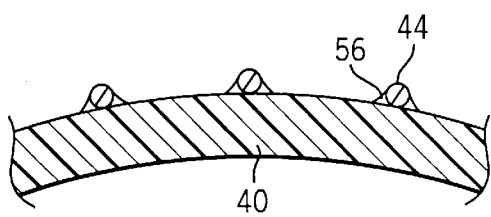
FIG. 4 is a figure similar to that of FIG. 3 showing a second embodiment of the invention in which conductors are adhesively bonded to the surface of the engine components.

Referring now to FIG. 4, in an alternative embodiment, the conductors 44 may be flat wire conductors or conventional wires bonded by means of adhesive 56 to the surface of the continuous air induction system 40. Such bonding techniques are known in the art of printed wiring board manufacture and may use computer controlled wire or conductor guiding tools to lay out arbitrary paths on the surface of an insulating substrate.

Figure 5:
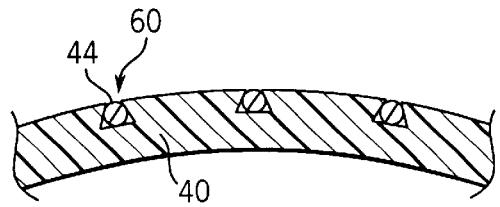
FIG. 5 is a figure similar to FIGS. 3 and 4 showing a third embodiment of the invention where conductors are mechanically attached to the engine components.

Referring now to FIG. 5 in yet a further alternative embodiment, the continuous air induction system 40 may have integral dovetailed grooves 60 or the like into which oversized wires may be pressed for mechanical support and attachment.

Figure 6A:
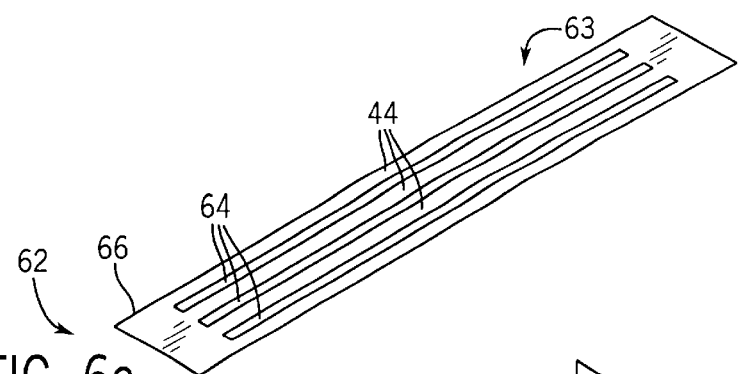
FIGS. 6a–d are perspective views of progressive steps of a fourth embodiment of the invention of forming a lead frame for in-molding with an engine component.

Referring now to FIGS. 6*a–d* in yet a further embodiment, conductors 44 may be in-molded at the surface of structural components of the engine such as may be molded out of plastic or the like. Initially as shown in FIG. 6a, conductors 44 may be manufactured as plated traces or a lead frame 62 die cut from a plated metallic strip 63 of the type used for manufacturing electrical connectors or from a more ductile material such as annealed copper. The strip 63 may have a number of longitudinal slots 64 providing separate conductors joined at the ends by bridging end sections 66.

Figure 6B:
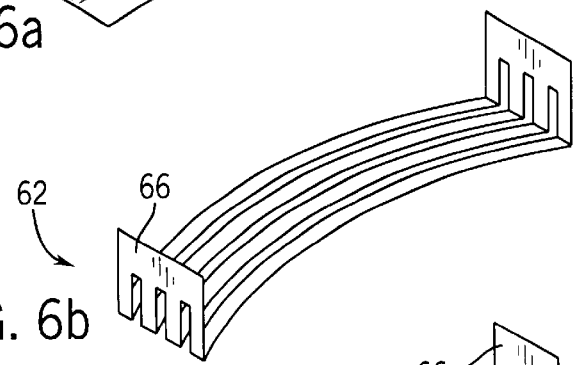
Figure 6C:
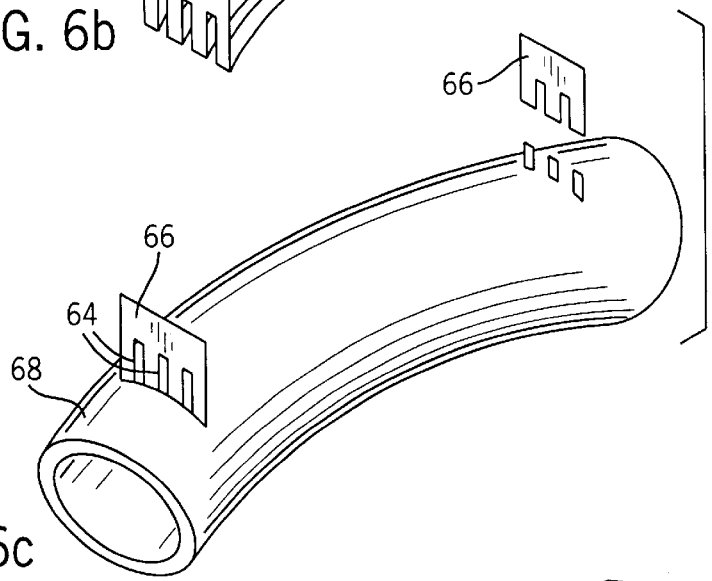
Figure 6D:
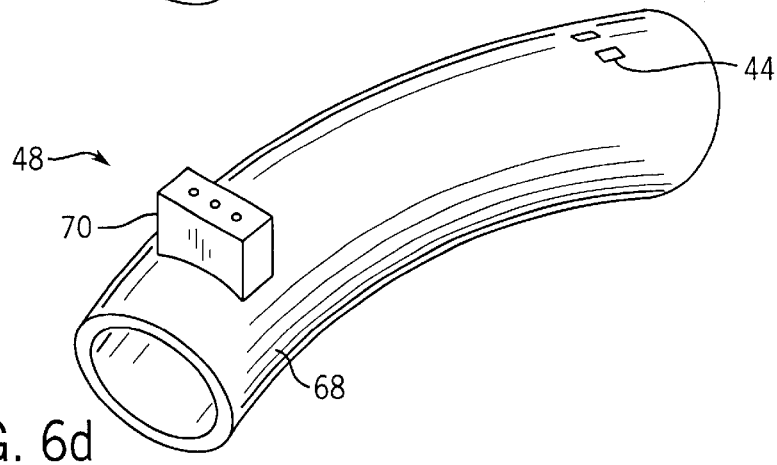

As shown in FIG. 6b, the strip 63 may be preformed in this case by giving it a slight bow to conform to an intake manifold pipe 68 and bending the ends at 90° for the attachment of conductors.

Thus formed, the lead frame 62 may be in-molded to an intake manifold pipe 68 so as to be wholly contained within the pipe wall except for the ends including the bridging end sections 66 and a portion of the slots 64. The bridging end sections 66 may be cut and removed leaving only projecting ends of the conductors 44 which may be folded down to form bonding or attaching pads for connection with other conductors or circuit elements or may be fit within a connector shell 70 separately formed and attached to the projecting ends or molded during the molding of the intake manifold pipe 68. Wiring interconnections between components joined by the intake manifold pipe 68 can thus be obtained using the intake manifold pipe 68 eliminating a separate harness. In a similar manner, sensors and electronic components such as integrated circuits and discrete devices such as transistors, resistors, diodes, capacitors and inductors, can be in-molded directly into the manifold pipe 68.

Figure 7:
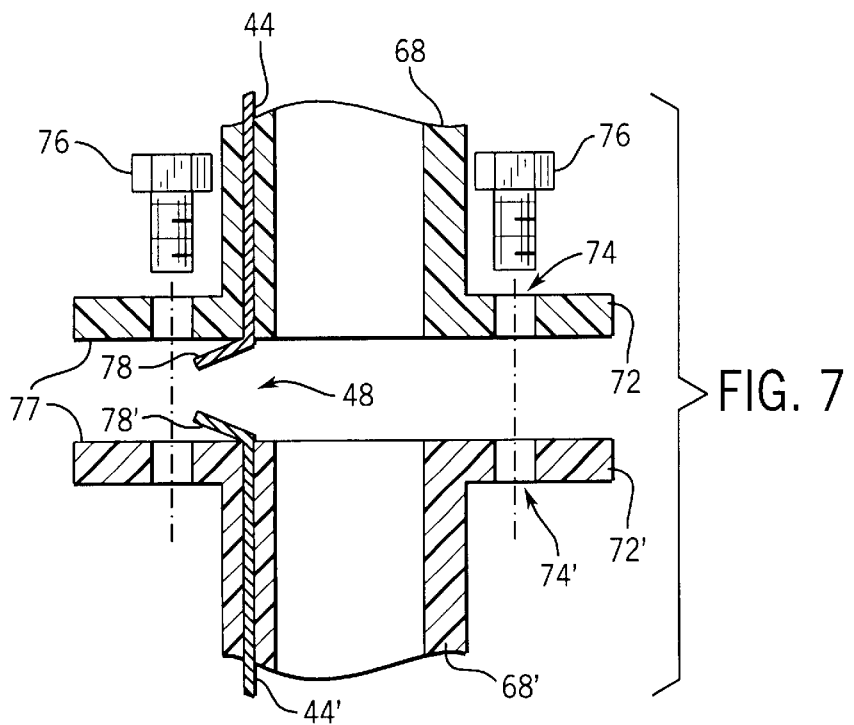
FIG. 7 is a cross-sectional view through two engine components having in molded conductors per FIG. 6 showing interconnection of the conductors with mechanical assembly of the components in a one step assembly operation.

Referring now to FIG. 7, the mechanical component supporting the conductors 44 need not be a single continuous part but may be fabricated in sections that are mechanically and electrically attached to each other. In this case, the connector 48 may be used to electrically join conductors 44 of adjacent mechanically assembled components, for example, using short jumper harnesses (not shown).

Alternatively, the connectors 48 may be constructed to connect directly to connectors of adjacent parts when the parts are assembled and without the need for a separate electrical connection step. Thus, for example, an intake manifold pipe 68 of the type shown in FIG. 6 may be attached to a second intake manifold pipe 68' by means of flanges 72 and 72' at one end of each of the intake manifold pipes 68 and 68', respectively. Flanges 72 and 72' present opposed substantially planar faces 77 generally perpendicular to the extent of the intake manifold pipe 68 and 68' that may be held together by bolts 76 inserted through bolt holes 74 and 74' in the flanges 72 and 72' when the flanges 72 and 72' abut.

In-molded conductors 44 and 44' in intake manifold pipe 68 and 68', respectively, may emerge at the planar faces 77 at projecting tabs 78 and 78'. Projecting tabs 78 and 78' may then be given a suitable bend so that conductors 44 and 44' may engage each other automatically when flanges 72 and 72' are assembled. In this manner, mechanical assembly also serves the purpose of electrical assembly.

Figure 8:
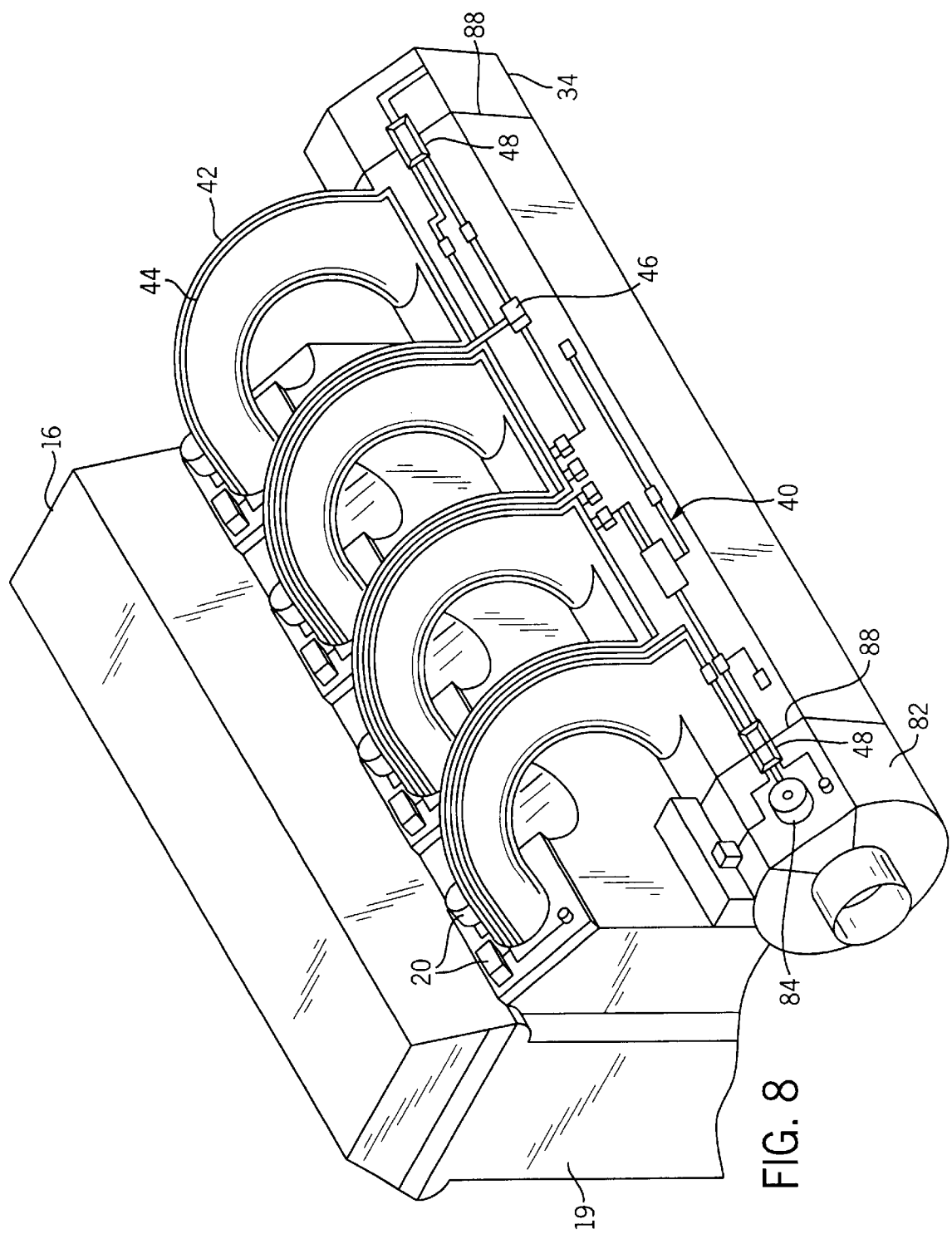
FIG. 8 is a figure similar to FIG. 2 showing an alternative embodiment of the invention.

Referring now to FIG. 8, in an alternative embodiment shown for a 4-cylinder engine, a continuous air induction system 40 may be integrally molded with the manifold portion 42 and may carry on its surface conductors 44 and circuits 46. Additional components of the alternator 34 and a throttle body 82 may be attached to this structure so as to provide a continuous path of electrical interconnection even though, at least for the alternator 34, such a connection would not be necessitated for mechanical purposes. The throttle body 82 may include, for example, sensors such as a throttle plate position sensor 84 and the like and may be joined to conductors 44 on the manifold portion 42 by means of surface conductor halves 48 such as may be attached to expose portions of the conductors 44 to allow for their continuation across mechanical interface 88 between continuous air induction system 40 and throttle body 82. A similar connector half 48' may serve this function for the alternator.

It is specifically intended that the present invention not be limited to the embodiments and illustrations contained herein, but modified forms of those embodiments including portions of the embodiments and combinations of elements of different embodiments as come within the scope of the following claims.

We claim:

1. An interconnect circuitry system for use with a vehicle engine having control electronics communicating with engine mounted control devices, the interconnect circuitry system comprising:

at least one structural engine component which when assembled to an engine presents a dimension spanning a distance between the control electronics and at least one of the engine mounted control devices;

electrical conductors attached integrally to the structural engine component to be supported and guided thereby along the dimension, wherein the electrical conductors are attached to a surface of the structural engine component;

whereby assembly of the structural engine component to the engine also provides interconnection between the control electronics and the engine mounted control devices.

2. The interconnect circuitry system of claim 1 wherein the structural component is selected from the group consisting of: the engine intake manifold, valve cover, throttle body, air filter housing and engine shrouding.

3. The interconnect circuitry system of claim 1, wherein the surface is an outer surface.

4. The interconnect circuitry system of claim 1 wherein the surface is an inner surface within the structural engine component.

5. The interconnect circuitry system of claim 1 wherein the electrical conductors are metal plated on the structural component.

6. The interconnect circuitry system of claim 1 wherein the structural component is molded polymer and the electrical conductors are preformed metal conductors.

7. The interconnect circuitry system of claim 6 including in addition circuit elements selected from the group consisting of sensors and electronic components that are at least one of in-molded and attached to a surface of the structural engine component.

8. The interconnect circuitry system of claim 1 wherein the electrical conductors are metal conductors adhesively bonded on the surface of the structural component.

9. The interconnect circuitry system of claim 1 wherein the electrical conductors are metal conductors mechanically affixed to the surface of the structural component.

10. The interconnect circuitry system of claim 1 further including at least one electrical connector integrally attached to the structural component and electrically communicating with the electrical conductors.

11. The interconnect circuitry system of claim 10 wherein the electrical connector is positioned at a point of attachment of the structural component with an other engine part so as to electrically connect to other electrical conductors on the other engine part when the structural component is mechanically attached to the other engine part.

12. The interconnect circuitry system of claim 1 wherein the electrical conductors include bonding surfaces, and further including solid state circuitry attached to the at least one structural component and the electrical conductors at the bonding surfaces.

13. The interconnect circuitry system of claim 12 wherein the structural components include a cover plate attachable to the structural components to fit over the solid-state circuitry attached at the bonding surfaces.

14. A method of providing wiring in a vehicle engine between control electronics and engine mounted control devices, the method comprising the steps of:
  (a) identifying at least one structural engine component which when assembled to an engine presents a dimension spanning a distance between the control electronics and at least one of the engine mounted control devices;
  (b) integrally attaching electrical conductors to a surface of the at least one structural engine component to be supported and guided thereby along the dimension; and
  (c) assembling the at least one structural engine component to the vehicle engine to provide interconnect wiring between the control electronics and the engine mounted control devices.

15. The method of claim 14 wherein the structural component is selected from the group consisting of: the engine intake manifold, valve cover, throttle body, air filter housing and engine shrouding.

16. The method of claim 14 wherein the electrical conductors are attached to at least one of an outer surface and an inner surface of the structural engine component.

17. The method of claim 14 wherein step (b) includes the step of plating the electrical conductors on the structural component.

18. The method of claim 14, further comprising the steps of preforming additional electrical conductors and in-molding the preformed additional electrical conductors into the structural component during a molding of the structural component.

19. The method of claim 14 further including the step of attaching circuit elements selected from the group consisting of sensors and electronic components to the structural component that is attached to the electrical conductors.

20. The method of claim 14 wherein step (b) includes the step of adhesively bonding electrical conductors on a surface of the structural component.

21. The method of claim 14 wherein step (b) includes the step of mechanically affixing metal conductors to a surface of the structural component.

22. The method of claim 14 further including the step of attaching at least one electrical connector integrally to the structural component so as to be electrically communicating with the electrical conductors.

23. The method of claim 22 including the step of positioning the electrical connector at a point of attachment of the structural component with an other engine part so as to electrically connect to other electrical conductors on the other engine part when the structural component is mechanically attached to the other engine part.

24. The method of claim 14 wherein at step (b) the electrical conductors are attached to provide exposed bonding surfaces, and further including the step of attaching solid state circuitry to the structural component and the electrical conductors at the bonding surfaces.

25. The method of claim 14 including the step of attaching a cover plate to the structural component to fit over the solid-state circuitry attached at the bonding surfaces.

26. An interconnect circuitry system for use with a vehicle engine having control electronics communicating with engine mounted control devices, the interconnect circuitry system comprising:
  means for providing a dimension spanning a distance between the control electronics and at least one of the engine mounted control devices when assembled to an engine; and
  means for conducting electricity attached integrally to a surface of the providing means;
  whereby assembly of the providing means to the engine also provides interconnection between the control electronics and the engine mounted control devices.

* * * * *

UNITED STATES PATENT AND TRADEMARK OFFICE
CERTIFICATE OF CORRECTION

PATENT NO. : 6,408,811 B1  Page 1 of 1
DATED : June 25, 2002
INVENTOR(S) : Andrew Zachary Glovatsky, Jay DeAvis Baker and Myron Lemecha It is certified that error appears in the above-identified patent and that said Letters Patent is hereby corrected as shown below:

<u>Column 3,</u>
Line 39, "in molded" should be -- in-molded --.

<u>Column 4,</u>
Line 38, "directly-with" should be -- directly with --.

Signed and Sealed this

Nineteenth Day of November, 2002

*Attest:*

*Attesting Officer*

JAMES E. ROGAN
*Director of the United States Patent and Trademark Office*